United States Patent [19]

Shim

[11] Patent Number: 5,390,137
[45] Date of Patent: Feb. 14, 1995

[54] CARRY TRANSFER APPARATUS

[75] Inventor: Jae C. Shim, Kyungsangbook-Do, Rep. of Korea

[73] Assignee: Goldstar Electron Co., Ltd., Choongchungbook-Do, Rep. of Korea

[21] Appl. No.: 177,496

[22] Filed: Jan. 5, 1994

[30] Foreign Application Priority Data

Mar. 26, 1993 [KR] Rep. of Korea ................ 4606/1993

[51] Int. Cl.$^6$ ................................................ G06F 7/50
[52] U.S. Cl. .................................................... 364/787
[58] Field of Search .................................. 364/786, 787

[56] References Cited

U.S. PATENT DOCUMENTS

| | | |
|---|---|---|
| 3,717,755 | 2/1973 | Briley . |
| 3,728,532 | 4/1973 | Pryor . |
| 3,843,876 | 10/1974 | Fette et al. . |
| 4,425,623 | 1/1984 | Russell . |
| 4,504,924 | 3/1985 | Cook et al. . |
| 4,763,295 | 8/1988 | Yamada et al. ............... 364/786 |

Primary Examiner—Tan V. Mai
Attorney, Agent, or Firm—Lowe, Price, LeBlanc & Becker

[57] ABSTRACT

A carry transfer apparatus having a plurality of groups is provided. Each of the groups contains an inverter having an input terminal connected to a first signal input terminal, a first NMOS transistor having a gate connected to an output terminal of the inverter and a drain connected to a second signal input terminal, a PMOS transistor having a gate connected to the output terminal of the inverter, a source connected to a power source voltage terminal and a drain connected to a source of a PMOS transistor in the next group, a second NMOS transistor having a gate connected to the output terminal of the inverter and a drain connected to a ground voltage terminal, a third NMOS transistor having a gate connected to a source of the second NMOS transistor and to a gate of a corresponding NMOS transistor in the next group, a drain connected to a carry signal input terminal and a source connected to a source of the first NMOS transistor, a fourth NMOS transistor having a gate connected to the first signal input terminal, a drain connected to the carry signal input terminal and a source connected to the sources of the first and third NMOS transistors and to a drain of a corresponding NMOS transistor in the next group, and an exclusive-NOR gate having two input terminals coupled respectively to the first and carry signal input terminals.

2 Claims, 2 Drawing Sheets

CARRY TRANSFER APPARATUS

BACKGROUND OF THE INVENTION

1. Field of the Invention

The present invention relates in general to fast carry transfer apparatus, and more particularly to a carry transfer apparatus in which a reduced number of transistors are used to reduce a layout area of a chip and a transfer delay time of a carry signal in designing a logic circuit.

2. Description of the Prior Art

Referring to FIG. 1, there is shown a detailed circuit diagram of a conventional carry transfer apparatus. As shown in this drawing, the conventional carry transfer apparatus comprises first to fourth groups 10-40, inverters I1-I6 and NMOS transistors MN1-MN2.

The first group 10 comprises NMOS transistors MN13 and MN14. The NMOS transistor MN13 has a gate connected to a first signal input terminal S4$b$ and a drain connected to a second signal input terminal C4$b$. Similarly, the NMOS transistor MN14 has a gate connected to the first signal input terminal S4$b$ and a drain connected to the second signal input terminal C4$b$.

Also, the first group 10 comprises an exclusive-NOR gate EXR11 having one input terminal connected to the first signal input terminal S4$b$, an inverter I11 having an input terminal connected to the first signal input terminal S4$b$, and NMOS transistors MN11 and MN12.

The NMOS transistor MN11 has a gate connected to an output terminal of the inverter I11, a source connected to a source of the NMOS transistor MN13 and a drain connected to a power source voltage terminal $V_{DD}$. The NMOS transistor MN12 has a gate connected to the output terminal of the inverter I11, a source connected to a source of the NMOS transistor MN14 and a drain connected to a ground voltage terminal GND.

The first group 10 also comprises an inverter I12 having an input terminal connected to the power source voltage terminal $V_{DD}$, an inverter I13 having an input terminal connected to the ground voltage terminal GND, and NMOS transistors MN15 and MN16.

The NMOS transistor MN15 has a drain connected to an output terminal of the inverter I12 and a source connected to the other input terminal of the exclusive-NOR gate EXR11. The NMOS transistor MN16 has a drain connected to an output terminal of the inverter I13 and a source connected to the other input terminal of the exclusive-NOR gate EXR11.

In the same manner as those of the first group 10, the second to fourth groups 20-40 have NMOS transistors MN21-MN26, MN31-MN36 and MN41-MN46, inverters I21-I23, I31-I33 and I41-I43 and exclusive-NOR gates EXR21, EXR31 and EXR41, respectively, associated with first signal input terminals S5$b$-S7$b$ and second signal input terminals C5$b$-C7$b$.

The inverters I1 and I2 are connected in series to a carry signal input terminal C1. An output terminal of the inverter I2 is connected to gates of the NMOS transistors MN15, MN25, MN35 and MN45 in the first to fourth groups 10-40 and a gate of the NMOS transistor MN1. An output terminal of the inverter I1 is connected to gates of the NMOS transistors MN16, MN26, MN36 and MN46 in the first to fourth groups 10-40 and a gate of the NMOS transistor MN2.

As mentioned above, the drain of the NMOS transistor MN11 in the first group 10 is connected to the power source voltage terminal $V_{DD}$. The source of the NMOS transistor MN11 in the first group 10 is connected to drains of the NMOS transistors MN21, MN31 and MN41 in the second to fourth groups 20-40. The inverters I3 and I4 are connected in series to a source of the NMOS transistor MN41 in the fourth group 40. An output terminal of the inverter I4 is connected to a drain of the NMOS transistor MN1.

Also, the drain of the NMOS transistor MN12 in the first group 10 is connected to the ground voltage terminal GND. The source of the NMOS transistor MN12 in the first group 10 is connected to drains of the NMOS transistors MN22, MN32 and MN42 in the second to fourth groups 20-40. The inverters I5 and I6 are connected in series to a source of the NMOS transistor MN42 in the fourth group 40. An output terminal of the inverter I6 is connected to a drain of the NMOS transistor MN2. Sources of the NMOS transistors MN1 and MN2 are connected in common. A common connection point of the sources of the NMOS transistors MN1 and MN2 is connected to a carry signal output terminal C2.

The operation of the conventional carry transfer apparatus with the above-mentioned construction will hereinafter be described.

First, if the carry signal C1 is logically low, an output signal from the inverter I1 is logically high and an output signal from the inverter I2 is logically low.

The low output signal from the inverter I2 turns off the NMOS transistor MN15 in the first group 10, whereas the high output signal from the inverter I1 turns on the NMOS transistor MN16 in the first group 10. As a result, the NMOS transistors MN12 and MN14 in the first group 10 are turned on.

On the contrary, if the carry signal C1 is logically high, the output signal from the inverter I1 is logically low and the output signal from the inverter I2 is logically high.

The high output signal from the inverter I2 turns on the NMOS transistor MN15 in the first group 10, whereas the low output signal from the inverter I1 turns off the NMOS transistor MN16 in the first group 10. As a result, the NMOS transistors MN11 and MN13 in the first group 10 are turned on.

With the above operation performed, the final signals S4-S7 are outputted by summing the first input signals S4$b$-S7$b$ with the carry signal C1. At this time, the second input signals C4$b$-C7$b$ are outputted as the carry signal C2 when all of them are logically high.

In the case where all the first input signals S4$b$-S7$b$ are logically low and all the second input signals C4$b$-C7$b$ are logically low, the carry signal C1 is not transferred to the next stage, thereby causing the carry signal C2 to become logically low. Also, in the case where all the first input signals S4$b$-S7$b$ are logically high and all the second input signals C4$b$-C7$b$ are logically low, the carry signal C1 is transferred to the next stage. In this case, the carry signal C1 is outputted as the carry signal C2.

Namely, upon receiving the first and second input signals S4$b$-S7$b$ and C4$b$-C7$b$, the groups 10-40 perform carry operations of the first and second input signals S4$b$-S7$b$ and C4$b$-C7$b$. Therefore, a transfer speed of the input signals C4$b$-C7$b$ and the carry signal C1 becomes fast.

At this time, a transfer delay time of the carry signal C1 is determined by summing a transfer time of the carry signal C1 based on the power source voltage $V_{DD}$ and the ground voltage GND and a switching time of the NMOS transistors MN1 and MN2.

However, the above-mentioned conventional carry transfer apparatus has a disadvantage in that the transistors used in each group are large in number, resulting in an increase in a layout area of a chip and an increase in the transfer delay time of the carry signal in designing a logic circuit.

SUMMARY OF THE INVENTION

Therefore, the present invention has been made in view of the above problem, and it is an object of the present invention to provide a carry transfer apparatus in which a reduced number of transistors are used in each group to reduce a layout area of a chip and a transfer delay time of a carry signal in designing a logic circuit.

In accordance with the present invention, the above and other objects can be accomplished by a provision of a carry transfer apparatus comprising a plurality of groups, each of said groups comprising a first inverter having an input terminal connected to a first signal input terminal; a first NMOS transistor having a gate connected to an output terminal of said first inverter and a drain connected to a second signal input terminal; a PMOS transistor having a gate connected to the output terminal of said first inverter, a source connected to a power source voltage terminal and a drain connected to a source of a PMOS transistor in the next group; a second NMOS transistor having a gate connected to the output terminal of said first inverter and a drain connected to a ground voltage terminal; a third NMOS transistor having a gate connected to a source of said second NMOS transistor and to a gate of a corresponding NMOS transistor in the next group, a drain connected to a carry signal input terminal and a source connected to a source of said first NMOS transistor; a fourth NMOS transistor having a gate connected to the first signal input terminal, a drain connected to the carry signal input terminal and a source connected to the sources of said first and third NMOS transistors and to a drain of a corresponding NMOS transistor in the next group; and an exclusive-NOR gate having one input terminal connected to the first signal input terminal and the other input terminal connected to the carry signal input terminal; the drain of said PMOS transistor in the last group being connected to the gate of said third NMOS transistor in the last group.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 1:
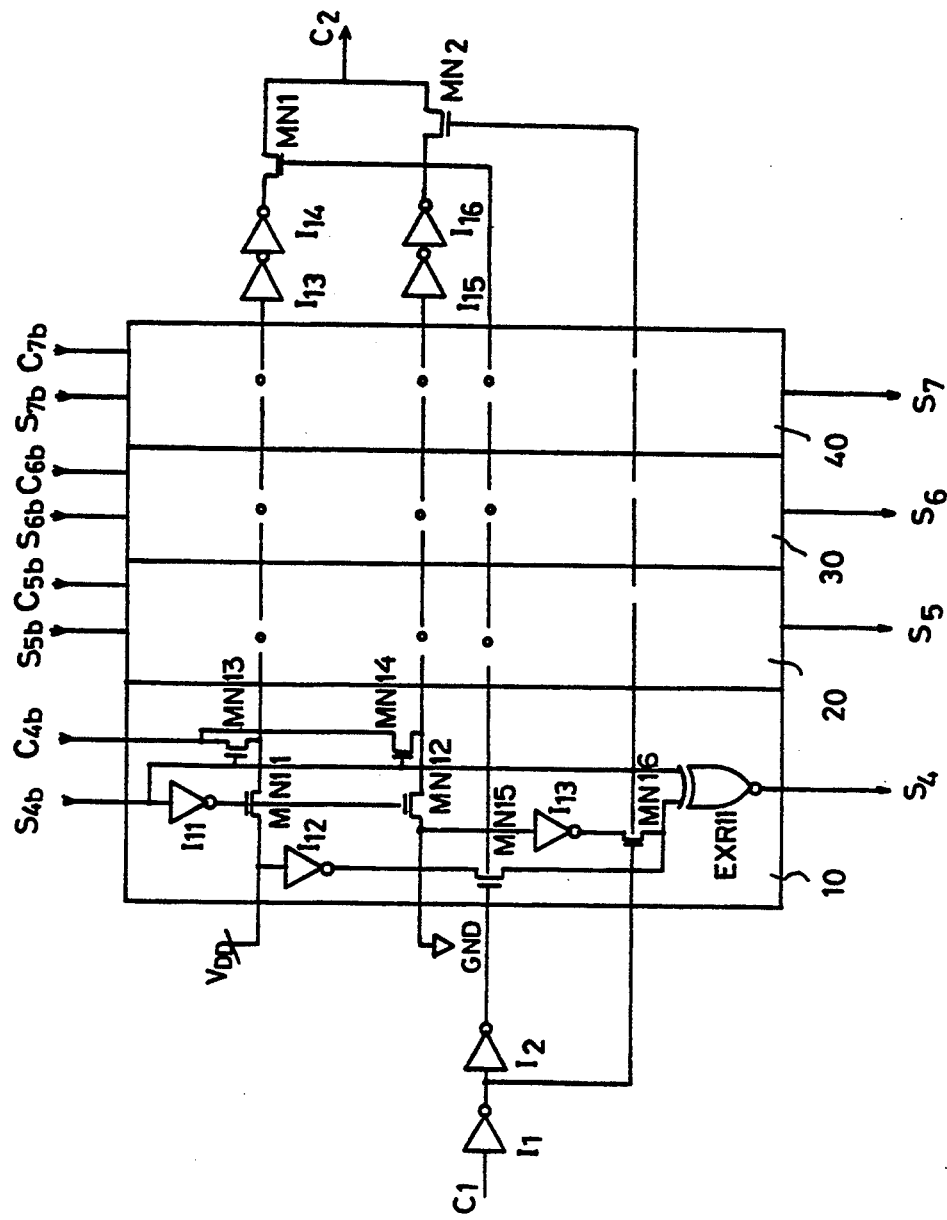
FIG. 1 is a detailed circuit diagram of a conventional carry transfer apparatus.
Figure 2:
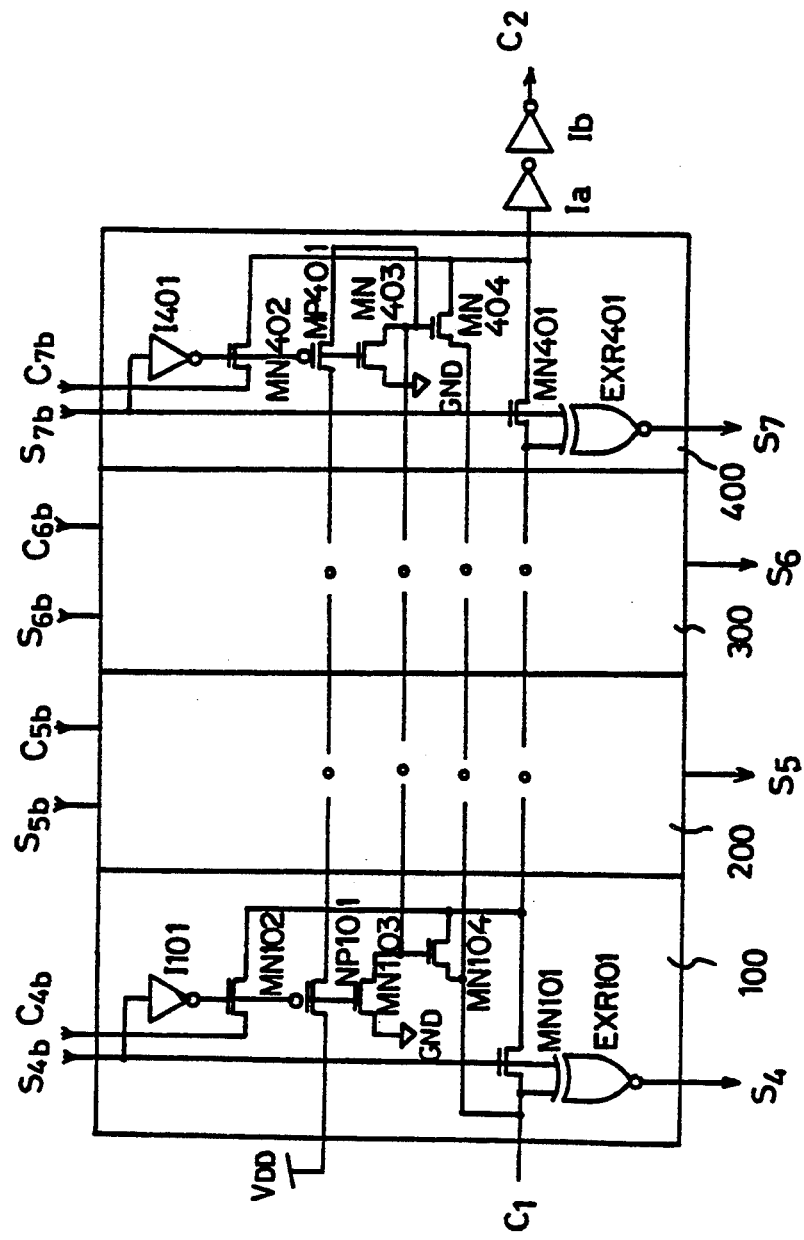
FIG. 2 is a detailed circuit diagram of a carry transfer apparatus in accordance with the present invention.

Referring to FIG. 2, there is shown a detailed circuit diagram of a carry transfer apparatus in accordance with the present invention. As shown in this drawing, the carry transfer apparatus comprises first to fourth groups 100-400, and inverters Ia and Ib.

The first group 100 comprises an inverter I101 having an input terminal connected to a first signal input terminal S4b, an exclusive-NOR gate EXR101 having one input terminal connected to the first signal input terminal S4b, NMOS transistors MN101-MN104 and a PMOS transistor MP101.

The NMOS transistor MN102 has a gate connected to an output terminal of the inverter I101 and a drain connected to a second signal input terminal C4b. The PMOS transistor MP101 has a gate connected to the output terminal of the inverter I101, a source connected to a power source voltage terminal $V_{DD}$ and a drain connected to a source of a PMOS transistor MP201 in the next group 200.

The NMOS transistor MN103 has a gate connected to the output terminal of the inverter I101 and a drain connected to a ground voltage terminal GND. The NMOS transistor MN104 has a gate connected to a source of the NMOS transistor MN103 and to a gate of a NMOS transistor MN204 in the next group 200, a drain connected to a carry signal input terminal C1 and a source connected to a source of the NMOS transistor MN102.

The NMOS transistor MN101 has a gate connected to the first signal input terminal S4b, a drain connected to the carry signal input terminal C1 and a source connected to the sources of the NMOS transistors MN102 and MN104 and to a drain of a NMOS transistor MN201 in the next group 200. The carry signal C1 is also applied to the other input terminal of the exclusive-NOR gate EXR101.

In the same manner as those of the first group 100, the second to fourth groups 200-400 have NMOS transistors MN201-MN204, MN301-MN304 and MN401-MN404, PMOS transistors MP201, MP202 and MP203, inverters I201, I301 and I401 and exclusive-NOR gates EXR201, EXR301 and EXR401, respectively, associated with first signal input terminals S5b-S7b and second signal input terminals C5b-C7b.

The inverters Ia and Ib are connected in series between a source of the NMOS transistor MN401 in the fourth group 400 and a carry signal output terminal C2.

Noticeably, a drain of the PMOS transistor MP401 in the last group 400 is connected to a gate of the NMOS transistor MN404 in the last group 400.

The operation of the carry transfer apparatus with the above-mentioned construction in accordance with the present invention will hereinafter be described in detail.

First, in the case where the carry signal C1 is logically high and all the first input signals S4b-S7b are logically high, output signals from the inverters I101, I201, I301 and I401 in the first to fourth groups 100-400 are logically low. In the first group 100, the low output signal from the inverter I101 turns off the NMOS transistors MN102 and MN103 and turns on the PMOS transistor MP101. As a result, the NMOS transistors MN204, MN304 and MN404 in the second to fourth groups 200-400 are turned on by the power source voltage $V_{dd}$.

Also, the NMOS transistors MN101, MN201, MN301 and MN401 in the first to fourth groups 100-400 are turned on by the high states of the first input signals S4b-S7b, thereby causing the carry signal C1 to be outputted as the carry signal C2. In this case, the carry signal C1 has no effect on output signals S4-S7 from the exclusive-NOR gates EXR101-EXR401 in the first to fourth groups 100-400.

On the other hand, in the case where the carry signal C1 is logically high and at least one of the first input signals S4b–S7b is logically low, the output signals S4–S7 from the exclusive-NOR gates EXR101–EXR401 in the first to fourth groups 100–400 are dependent on the second input signals C5b–C7b.

Also, in the case where the second input signal C7b is logically high and the first input signal S7b is logically low, the second input signal C7b is outputted as the carry signal C2 through the inverters Ia and Ib. In this case, the second input signal C7b has no effect on the output signals S4–S7 from the exclusive-NOR gates EXR101–EXR401 in the first to fourth groups 100–400.

With the above operation performed, the final signals S4–S7 are outputted by summing the first input signals S4b–S7b with the carry signal C1. At this time, the second input signals C4b–C7b are outputted as the carry signal C2 when all of them are logically high.

In the case where all the first input signals S4b–S7b are logically low and all the second input signals C4b–C7b are logically low, the carry signal C1 is not transferred to the next stage, thereby causing the carry signal C2 to become logically low. Also, in the case where all the first input signals S4b–S7b are logically high and all the second input signals C4b–C7b are logically low, the carry signal C1 is transferred to the next stage. In this case, the carry signal C1 is outputted as the carry signal C2.

Namely, upon receiving the first and second input signals S4b–S7b and C4b–C7b, the groups 100–400 perform carry operations of the first and second input signals S4b–S7b and C4b–C7b. Therefore, the carry transfer operation is performed.

As apparent from the above description, according to the present invention, the reduced number of transistors are used in each group. This has the effect of reducing a layout area of a chip and a transfer delay time of the carry signal in designing a logic circuit.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A carry transfer apparatus comprising a plurality of groups, each of said groups comprising:
    a first inverter having an input terminal connected to a first signal input terminal;
    a first NMOS transistor having a gate connected to an output terminal of said first inverter and a drain connected to a second signal input terminal;
    a PMOS transistor having a gate connected to the output terminal of said first inverter, a source connected to a power source voltage terminal and a drain connected to a source of a PMOS transistor in the next group;
    a second NMOS transistor having a gate connected to the output terminal of said first inverter and a drain connected to a ground voltage terminal;
    a third NMOS transistor having a gate connected to a source of said second NMOS transistor and to a gate of a corresponding NMOS transistor in the next group, a drain connected to a carry signal input terminal and a source connected to a source of said first NMOS transistor;
    a fourth NMOS transistor having a gate connected to the first signal input terminal, a drain connected to the carry signal input terminal and a source connected to the sources of said first and third NMOS transistors and to a drain of a corresponding NMOS transistor in the next group; and
    an exclusive-NOR gate having one input terminal connected to the first signal input terminal and the other input terminal coupled to the carry signal input terminal;
    the drain of said PMOS transistor in the last group being connected to the gate of said third NMOS transistor in the last group.

2. A carry transfer apparatus as set forth in claim 1, further comprising:
    second and third inverters connected in series between the source of said fourth NMOS transistor in the last group and a carry signal output terminal.

* * * * *